(12) United States Patent
Martorell et al.

(10) Patent No.: US 11,942,409 B2
(45) Date of Patent: *Mar. 26, 2024

(54) HIGH DENSITY LOW POWER INTERCONNECT USING 3D DIE STACKING

(71) Applicant: MARVELL ASIA PTE, LTD., Singapore (SG)

(72) Inventors: Ferran Martorell, Barcelona (ES); Prasad Subramaniam, Stirling, NJ (US)

(73) Assignee: MARVELL ASIA PTE LTD, Singapore (SG)

( * ) Notice: Subject to any disclaimer, the term of this patent is extended or adjusted under 35 U.S.C. 154(b) by 101 days.

This patent is subject to a terminal disclaimer.

(21) Appl. No.: 17/582,380

(22) Filed: Jan. 24, 2022

(65) Prior Publication Data

US 2022/0148957 A1    May 12, 2022

Related U.S. Application Data

(63) Continuation of application No. 16/748,633, filed on Jan. 21, 2020, now Pat. No. 11,233,002.

(60) Provisional application No. 62/914,241, filed on Oct. 11, 2019, provisional application No. 62/913,322, filed on Oct. 10, 2019.

(51) Int. Cl.
| *H01L 23/48* | (2006.01) |
| *H01L 21/304* | (2006.01) |
| *H01L 21/66* | (2006.01) |
| *H01L 21/768* | (2006.01) |
| *H01L 23/498* | (2006.01) |
| *H01L 23/528* | (2006.01) |
| *H01L 25/065* | (2023.01) |

(52) U.S. Cl.
CPC .... *H01L 23/49838* (2013.01); *H01L 21/3043* (2013.01); *H01L 21/768* (2013.01); *H01L 22/34* (2013.01); *H01L 23/528* (2013.01); *H01L 25/0655* (2013.01)

(58) Field of Classification Search
CPC ............ H01L 23/49838; H01L 21/768; H01L 25/0655
See application file for complete search history.

(56) References Cited

U.S. PATENT DOCUMENTS

| 9,455,193 | B2 | 9/2016 | Pincu et al. | |
| 10,120,149 | B1* | 11/2018 | Mathai ............... | G02B 6/29365 |
| 10,283,400 | B1 | 5/2019 | Kelly et al. | |
| 2007/0090506 | A1 | 4/2007 | Sundstrom | |
| 2007/0162621 | A1* | 7/2007 | Condorelli .......... | G06F 11/1608 |
| | | | | 710/1 |
| 2008/0155821 | A1 | 7/2008 | Hougham et al. | |
| 2009/0079091 | A1 | 3/2009 | Song et al. | |
| 2011/0121851 | A1 | 5/2011 | Lee et al. | |
| 2012/0032326 | A1 | 2/2012 | Kim et al. | |

(Continued)

*Primary Examiner* — Nicholas J Tobergte

(57) ABSTRACT

An integrated circuit includes a first set of dies, each die comprising circuitry and a second set of interposer dies. At least two dies of the first set of dies are connected to each other via at least one of the interposer dies. The at least one of the interposer dies includes first connections connected to a first die of the first set of dies, second connections connected to a second die of the first set of dies, and buffers connected between the first connections and the second connections. The buffers are configured to condition signals between the first die and the second die.

18 Claims, 16 Drawing Sheets

(56) References Cited

U.S. PATENT DOCUMENTS

| | | | |
|---|---|---|---|
| 2013/0027071 A1* | 1/2013 | Canegallo | G01R 1/07314 |
| | | | 324/754.21 |
| 2013/0200511 A1 | 8/2013 | Banijamali | |
| 2014/0064659 A1* | 3/2014 | Doerr | G02B 6/12 |
| | | | 385/14 |
| 2014/0167799 A1* | 6/2014 | Wang | H05F 3/02 |
| | | | 361/220 |
| 2015/0200216 A1* | 7/2015 | Muramatsu | H01L 27/1464 |
| | | | 438/72 |
| 2019/0164806 A1* | 5/2019 | Leobandung | H01L 21/82 |
| 2019/0204376 A1* | 7/2019 | Goyal | G01R 31/2813 |
| 2019/0295860 A1 | 9/2019 | van Dommelen et al. | |
| 2020/0243448 A1* | 7/2020 | Qian | H01L 21/4853 |
| 2020/0373235 A1* | 11/2020 | Collins | H01L 23/481 |
| 2021/0193577 A1* | 6/2021 | Lin | H01L 21/6835 |
| 2021/0351159 A1* | 11/2021 | Delacruz | H01L 24/89 |

* cited by examiner

HIGH DENSITY LOW POWER INTERCONNECT USING 3D DIE STACKING

CROSS REFERENCE TO RELATED APPLICATIONS

This application is a continuation of U.S. patent application Ser. No. 16/748,633, filed Jan. 21, 2020, which claims the benefit of U.S. Provisional Application No. 62/913,332, filed Oct. 10, 2019, and U.S. Provisional Application No. 62/914,241, filed Oct. 11, 2019. The entire disclosures of the applications referenced above are incorporated herein by reference.

BACKGROUND OF THE INVENTION

1. Field of the Disclosure

The present disclosure relates to integrated circuit design and more specifically to interconnecting multiple semiconductor dice implementing the integrated circuit design.

2. Description of the Related Art

Integrated circuits are manufactured on semiconductor wafers that are then diced to produce individual chips. Due to yield concerns, the fabrication process used to manufacture the integrated circuits imposes several limitations on the design of the integrated circuit. For instance, the fabrication process may restrict the minimum feature size, the minimum pitch between different element, and the maximum number of metal interconnect layers that can be used.

Semiconductor integrated circuit manufacturing processes further limit the size that an integrated circuit can occupy. As the size of the integrated circuit increases, the probability of a defect from being present in the integrated circuit increases. Thus, reducing the yield of the manufacturing process. However, as the complexity of circuits increases, the need for allowing circuit designer to be able to design circuits that occupy larger areas also increases. Even if a circuit designer decides to use a design that occupies a larger area, sacrificing yield of the manufacturing process, the size of a die is also limited by the reticle size and the capabilities of a stepper used during photolithography processes.

For example, Telecom application-specific integrated circuits (ASICs) that use 40 Tbps or higher bandwidth use 400 or more 100 Gbps Serializer/Deserializer (SerDes) interfaces. These circuits implement logic and memory circuitry that may not fit in a single die that complies with the size requirements imposed by modern manufacturing processes.

Simply splitting the circuit into multiple dice may not be a straightforward solution. If the design of the circuit is split into multiple dice, a communication medium that enables high speed and high bandwidth transfer of data between the dice is desirable. Without a high speed and high bandwidth communication medium, the components of the circuit design that are in different dice may not be able to properly communicate with each other.

SUMMARY

Embodiments relate to an electronic circuit implemented using a first logic die, a second logic die, and an interposer array connecting the first logic die to the second logic die. The first logic die implements a first subset of components of the electronic circuit. The first logic die includes an array of output contacts. The second logic die implements a second subset of components of the electronic circuit. The second logic die includes an array of input contacts. The interposer array includes a plurality of interposer dice. Each interposer die includes a plurality of input contacts and a plurality of output contacts. The array of output contacts of the first logic die is bonded to at least a subset of input contacts from the plurality of input contacts of an interposer die of the plurality of interposer dice. The array of input contacts of the second logic die is bonded to at least a subset of output contacts from the plurality of output contacts of the interposer die of the plurality of interposer dice.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1A:
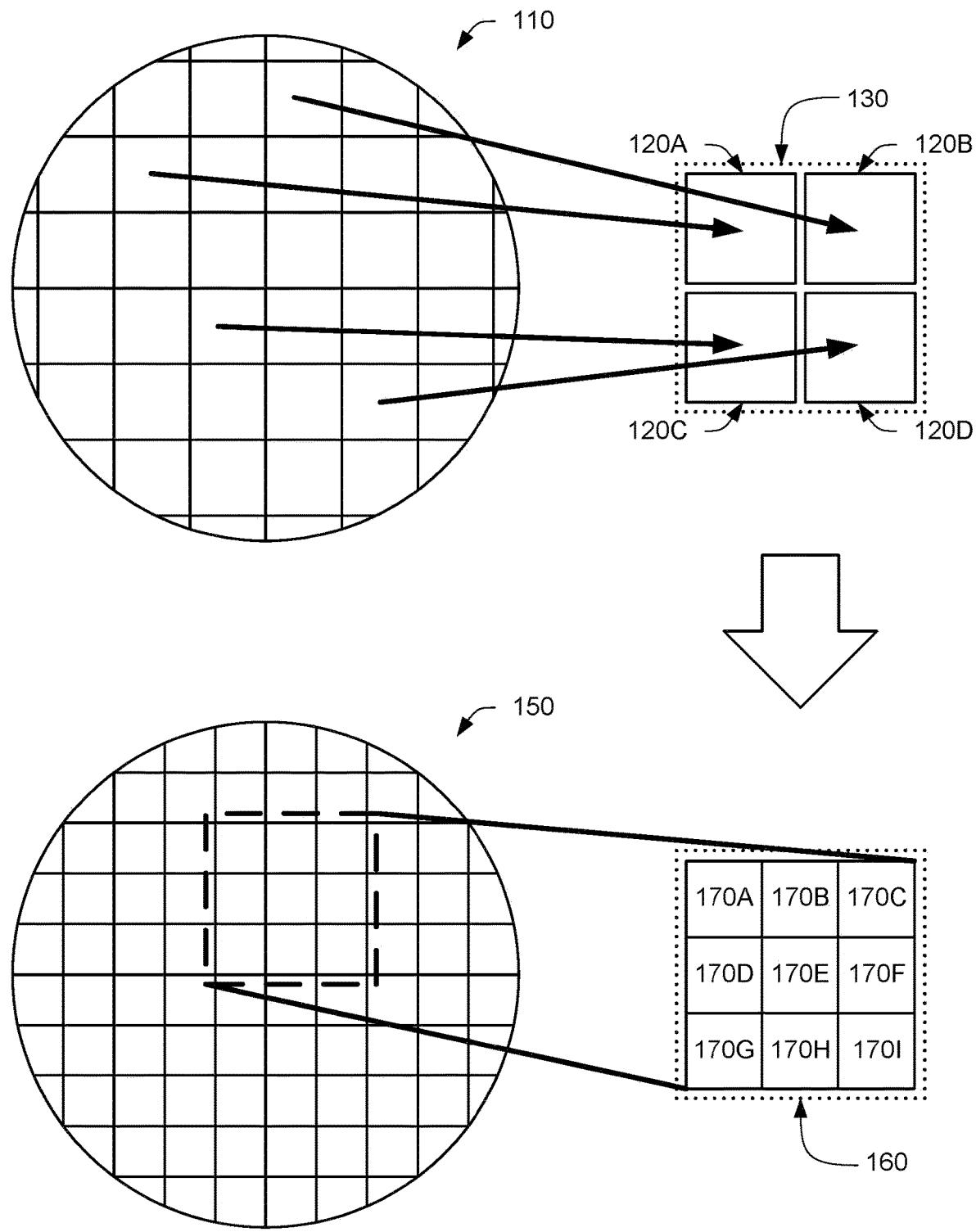
FIG. 1A is a top view of silicon dice, according to one embodiment.

FIG. 1A is a top view of silicon dice, according to one embodiment. Integrated circuits are fabricated on large wafers that are diced into individual dice. However, due to many constrains, the size of individual dice is oftentimes limited. For example, as the size of a die increases, the yield of the manufacturing process decreases as the probability of a defect from happening in a given die increases. As the complexity of modern systems increase, this size constrain plays a large role in the design and layout of very large scale integrated circuits.

In some systems, it would be advantageous to be able to design a die that is larger than the maximum die size prescribed by the fabrication process. To mitigate this, the design of the integrated circuit may be split into multiple dice. One portion of the split integrated circuit may communicate to a second portion of the split integrated circuit using a communication interface. However, splitting the integrated circuit into multiple dice may affect the signal integrity of signals going between dice. As such, the communication interface is designed to overcome any signal integrity losses that may arise due to the additional interconnect that may add parasitic inductance, capacitance, and resistance.

To reduce the degradation in signal quality, a die-on-wafer boding process is used. The die-on-wafer bonding process aligns individual dice containing portions of a large integrated circuit to a wafer implementing an interposer circuitry, and bonds the individual dice to the wafer.

In the example of FIG. 1, the integrated circuit is split into four different logic dice 120. The logic dice 120 are fabricated together in a wafer 110. In some embodiments, all of the dice 120A through 120D are fabricated in the same wafer and implement the same circuit design and layout. For instance, each of the dice may implement a subset of cores of a larger processor. In other embodiments, one or more of the logic dice 120 are fabricated in different wafers. Each of the logic dice 120 may implement a different design or layout. For example, the logic dice on the left side 120A and 120C implement a layout that is mirrored to the layout of the logic dice on the right side 120B and 120D. In other embodiments, each of the dice implement different circuitry altogether.

The four logic dice 120A-D are then arranged in a two-by-two grid pattern and aligned to the wafer 150 that implements interposer dice 170. Since the process for fabricating the interposer dice 170 (such as limitations in a reticle size) also limits the size of a die, the die size of the individual interposers is smaller than the size 130 of the individual logic dice 120 assembled together. In the example of FIG. 1, the interposers are designed to be one-ninth (⅑) of the size 130 of the four logic dice 120A-D assembled together. That is, the four logic dice 120A-D can be aligned on top of a three-by-three array 160 of interposer dice 170A-I. In some embodiments, each of the individual interposer die 170 have the same design and layout. Moreover, in some embodiments, although the logic dice 120A-D for a single circuit are aligned on top of multiple interposers, only a subset of interposers dice are aligned to are used to interconnect the logic dice 120A-D together. In other examples, other configurations may be used. For example, a configuration having four (4) logic dice and four (4) interposer dice, or a configuration having four (4) logic dice and sixteen (16) interposer dice may be used. In yet other embodiments, any ratio between the number of logic dice and the number of interposer dice may be used.

In some embodiments, wafer 110 where the logic dice 120 are implemented is fabricated using a technology node or process technology different from the technology node or process technology used to fabricate wafer 150 where the interposer dice 170 are implemented. For example, wafer 110 is fabricated using a technology node with smaller feature sizes than wafer 150. In addition, in some embodiments, wafer 110 and wafer 150 are fabricated by different foundries.

Figure 1B:
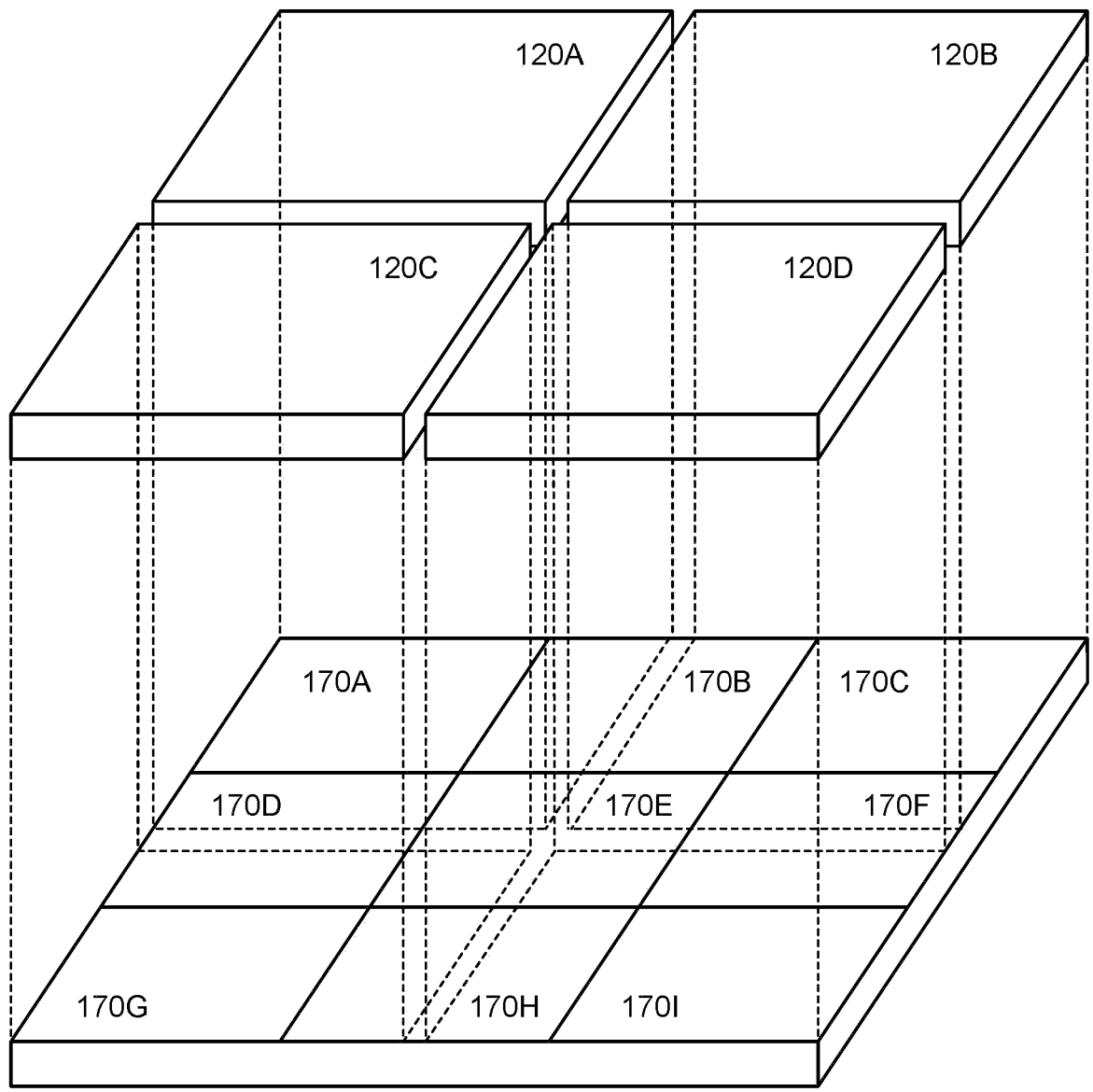
FIG. 1B illustrates an exploded elevation view of multiple logic dice aligned to an array of interposers.
Figure 1C:
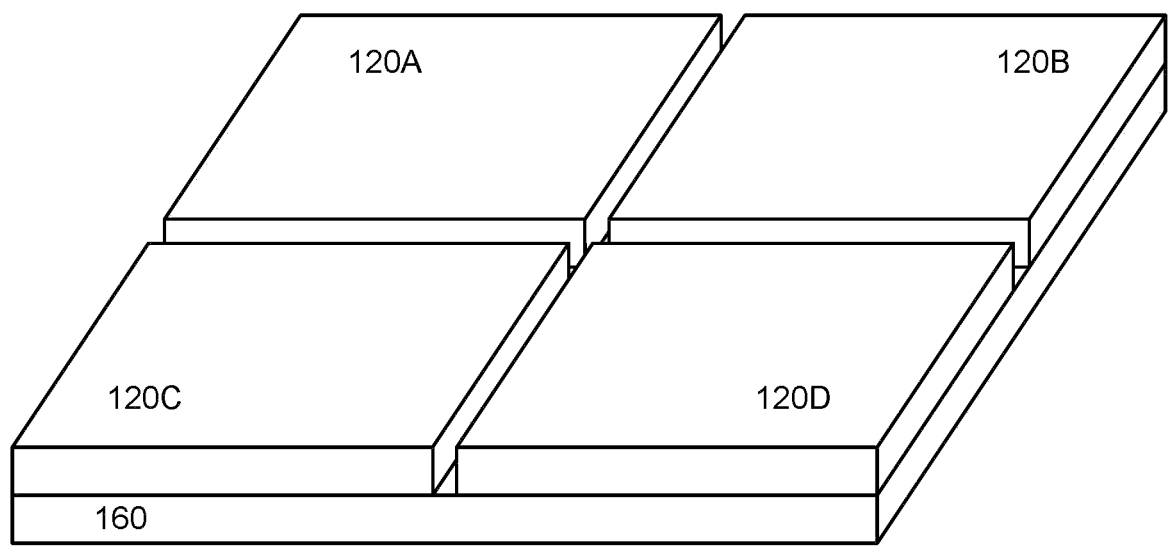
FIG. 1C is an elevation view of an integrated circuit implemented using multiple logic dice and an array of interposer dice, according to one embodiment.

FIG. 1B illustrates an exploded elevation view of multiple logic dice aligned to an array of interposers, according to one embodiment. FIG. 1C is an elevation view of an integrated circuit implemented using multiple logic dice and an array of interposer dice, according to one embodiment. In particular, FIGS. 1B-C illustrate a circuit implemented using four logic dice 120A-D aligned to a three-by-three array 160 of interposers 170. Each of the logic dice 120 are separately aligned to the interposer array 160. In one embodiment, the logic dice 120 are aligned to the interposer array 160 before the interposer array 160 is cut from the wafer 150. As such, every interposer die 170 implements the same circuitry and layout. However, since the logic dice 120 are aligned independently, each logic die 120 may implement a different circuitry or layout. In other embodiment, at least a subset of the logic dice 120 may implement the same circuitry and layout, but the logic dice 120 may be rotated with respect to each other.

Since, in the example of FIG. 1B, there are two logic dice 120 in the row direction and three interposer dice 170 in the row direction, the center interposer die 170 in the row direction may be used to connect the two logic dice 120 arranged in the row direction together. For example, interposer die 170B can be used to interconnect logic dice 120A and 120B together. Similarly, interposer die 170H can be used to interconnect logic dice 120C and 120D together.

Moreover, since there are two logic dice 120 in the vertical direction and three interposer dice 170 in the column direction, the center interposer die 170 in the column direction may be used to connect the two logic dice 120 arranged in the column direction. For example, interposer die 170D can be used to interconnect logic dice 120A and 120C together. Similarly, interposer die 170F can be used to interconnect logic dice 120B and 120D together.

Finally, since there are two logic dice 120 in the diagonal direction and three interposer dice 170 in the diagonal direction, the middle interposer die 170 may be used to connect all four logic dice 120 together. That is, since interposer die 170E overlaps with all four logic dice 120A-D, interposer die 170E can be used to interconnect all four logic dice 120A-D together.

Figure 2A:
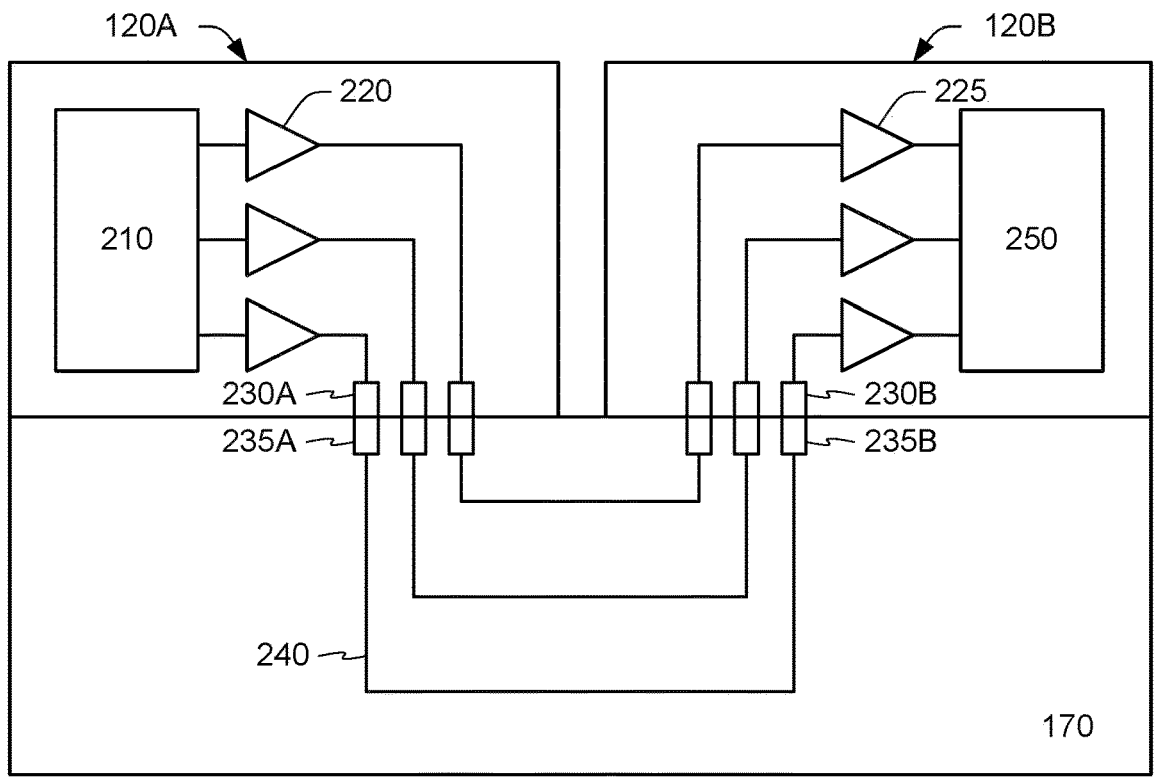
FIG. 2A is a circuit diagram illustrating a die stacking architecture, according to one embodiment.

FIG. 2A is a circuit diagram illustrating a die stacking architecture, according to one embodiment. In the example of FIG. 2A, a first logic die 120A and a second logic die 120B are connected to each other through an interposer die 170. The first logic die 120A includes circuitry 210 and the second logic die 120B include circuitry 250. In the example of FIG. 2A, circuitry 210 is to be connected to circuitry 250. Since circuitry 210 and circuitry 250 are in different dice, the output signals from circuitry 210 travel out of the first logic die 120A through contacts 230A, into interposer die 170 through contact 235A, through the interposer die 170 though interconnect 240, out of the interposer die 170 through contact 235B, and into the second logic die 120B through contact 230B. In some embodiments, the first logic die 120A has output buffers 220 that amplifies the signals before outputting the signals through contacts 230A. Similarly, the second logic die 120B has input buffers 225 that amplifies the signals after being received through contacts 230B.

In some embodiments, the output buffers 220 and input buffers 225 are logic circuits. For example, output buffers 220 and input buffers 225 may be inverters (NOT gates) or chains of inverters. Moreover, the boding process may enable contacts 230A and 230B to be densely packed to allow the use of a large number of interconnects. For instance, the contacts 230A and 230B may have a pitch between 1.4 μm and 4.4 μm. In other embodiments, larger pitch between contacts may be used.

Figure 2B:
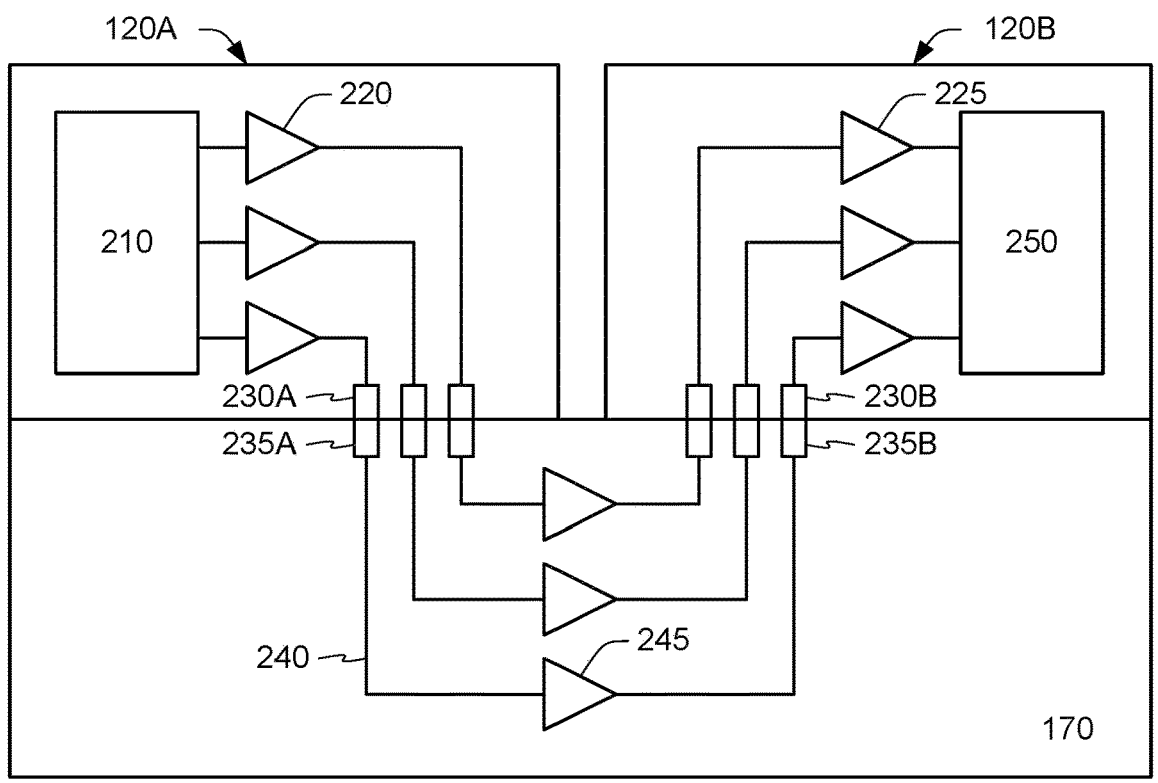
FIG. 2B is a circuit diagram illustrating a second die stacking architecture, according to one embodiment.

FIG. 2B is a circuit diagram illustrating a second die stacking architecture, according to one embodiment. In the architecture of FIG. 2B, the interposer includes active components to improve the integrity of the signals received from the logic dice 120. For instance, in the example of FIG. 2B, the interposer die 170 includes buffers 245 that amplify the signals received from the first logic die 120A. Additionally, interposer die 170 may include additional circuitry such as level shifters, registers, flip-flops, and synchronization logic.

Figure 2C:
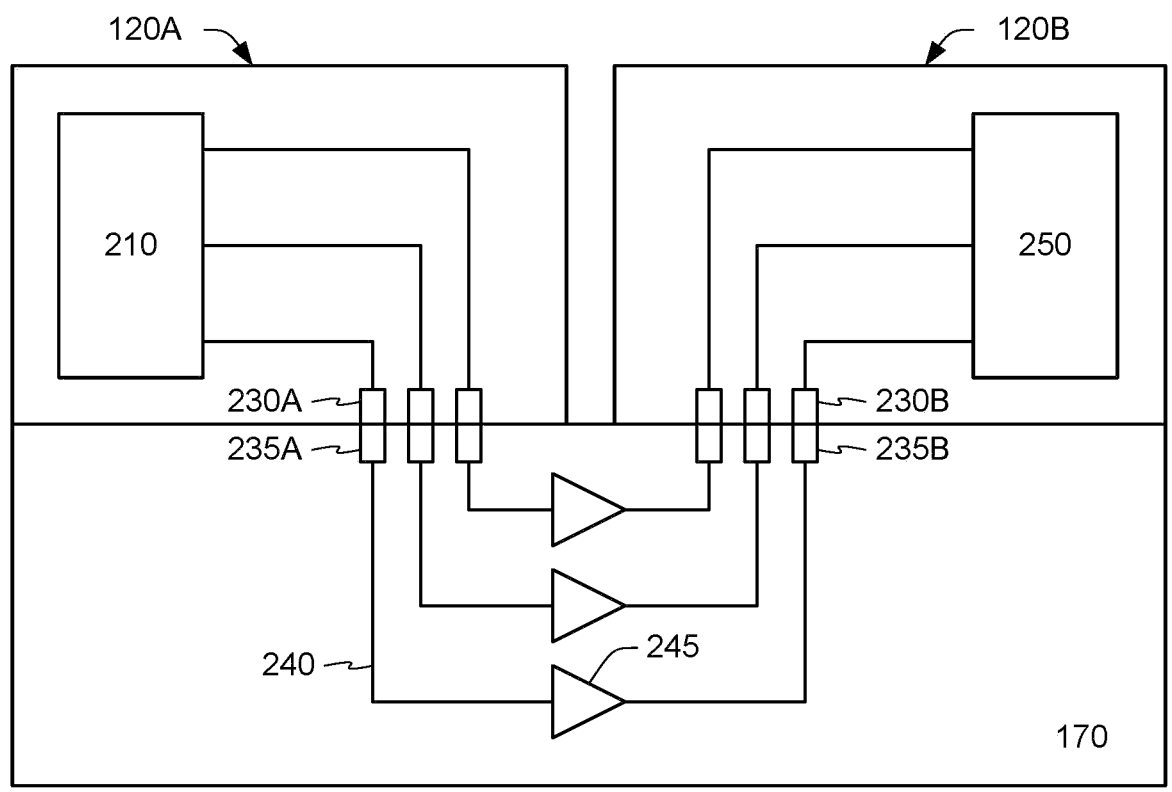
FIG. 2C is a circuit diagram illustrating a third die stacking architecture, according to one embodiment.

FIG. 2C is a circuit diagram illustrating a third die stacking architecture, according to one embodiment. In the architecture of FIG. 2C, the interposer includes active components such as buffers or amplifiers, but neither the first logic die 120A nor the second logic die 120B include buffers for signals that go through the interposer die 170. Instead, the buffers from included in the interposer may be designed to have a larger size sufficient to drive the signals in and out of the dice.

Figure 3A:
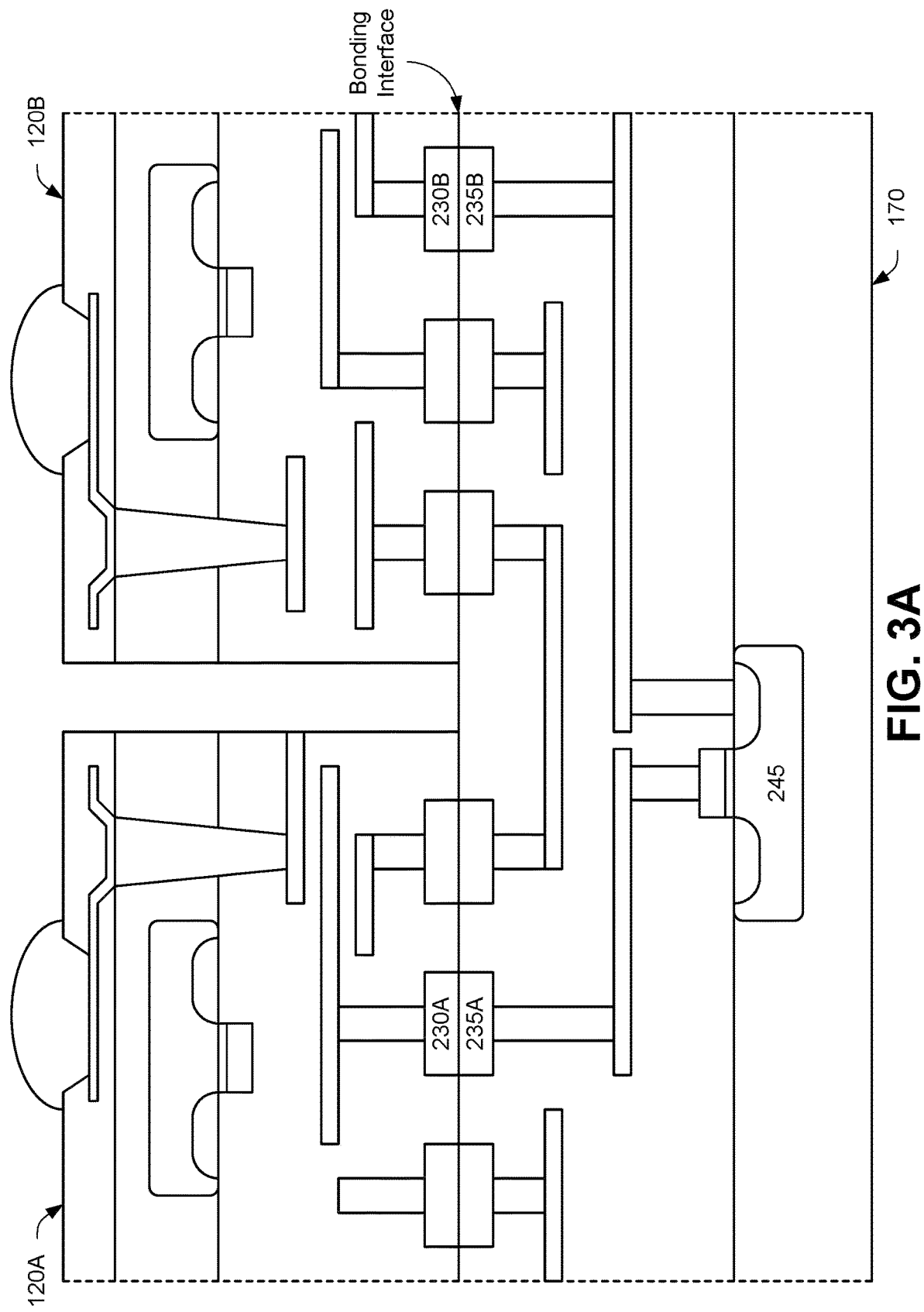
FIG. 3A is a cross-sectional view of stacked dice, according to one embodiment.

FIG. 3A is a cross-sectional view of stacked dice, according to one embodiment. The first logic die 120A includes contacts 230A that are aligned to contacts 235A of interposer die 170. Moreover, the second logic die 120B includes contacts 230B that are aligned to contacts 235B of interposer die 170. The first logic die 120A and the second logic die 120B are then bonded to the interposer die 170. In some embodiments, the bonding process includes a thermal process that bonds contacts 230A to contacts 235A and bonds contacts 230B to contacts 235B. For instance, the logic dice 120 and interposer dice 170 may be exposed to temperatures that are sufficient to melt or partially melt the metal contacts 230 and 235. When the logic dice 120 and the interposer dice 170 are cooled down, the metal contacts 230 are fused to corresponding metal contacts 235.

In some embodiments, the face of logic dice 120 are bonded to the face of interposer die 170. That is, top of logic dice 120 are bonded to the top of interposer dice 170. Moreover, in some embodiments, contacts are formed on the back side of logic dice 120 to allow the logic dice 120 to be connected to external components. For instance, the contacts in the back side of the logic dice 120 may be used to couple the logic dice 120 to a package substrate or a printed circuit board (PCB).

Figure 3B:
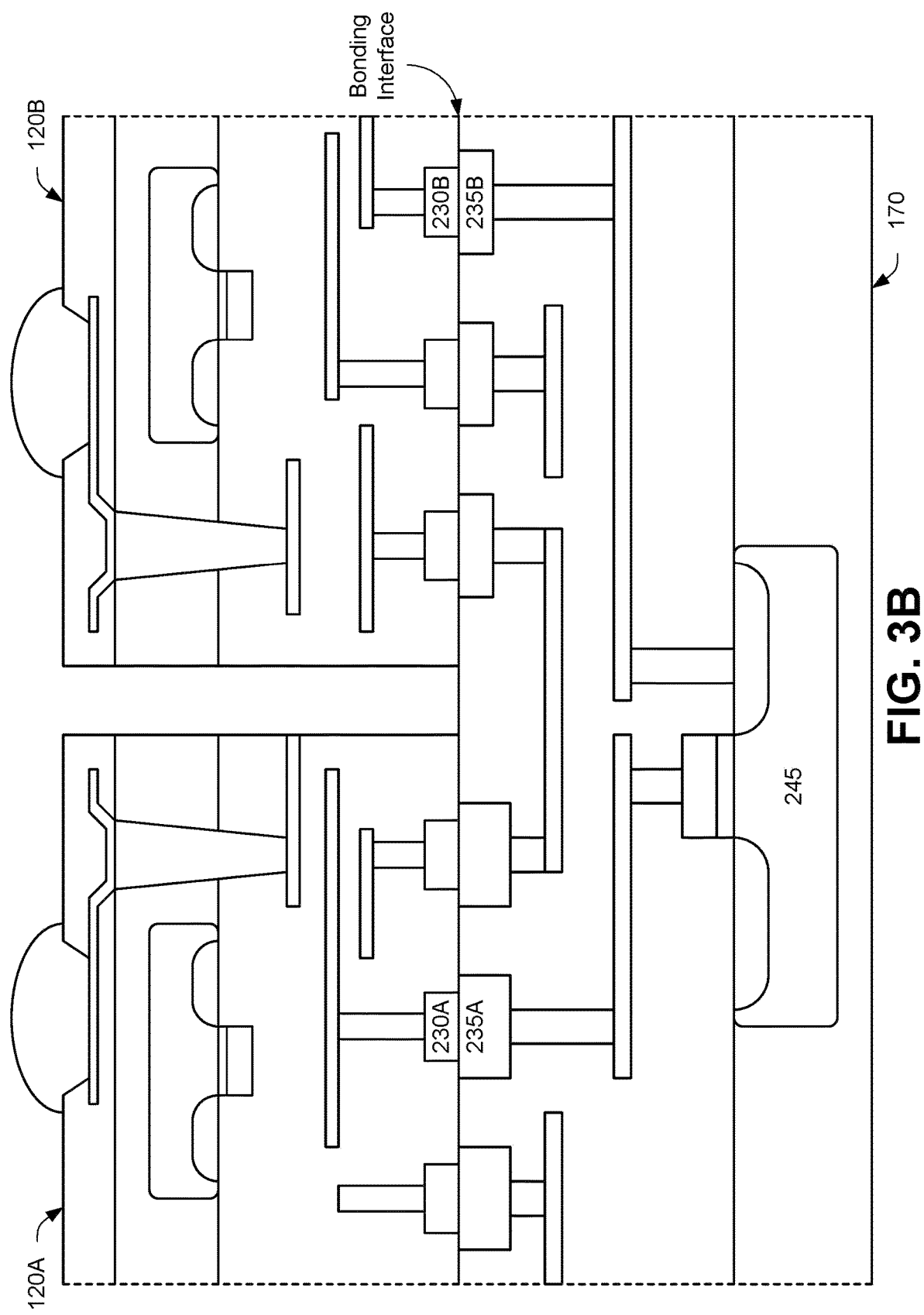
FIG. 3B is a cross-sectional view of stacked dice fabricated using different process technologies, according to one embodiment.

In some embodiments, logic dice 120 and interposer die 170 are fabricated using different technology nodes or process technologies. FIG. 3B is a cross-sectional view of stacked dice fabricated using different process technologies, according to one embodiment. In the example of FIG. 3B, logic dice 120 is fabricated using a technology node with smaller feature sizes than interposer die 170. In such embodiments, there might be a mismatch between the size of contacts 230 and contacts 235. For instance, if contacts 230 of logic dice 120 may have a smaller area than contacts 235 of interposer die 170. In other embodiments, the technology rules allow for the logic dice 120 to have contacts 230 having the same area and as the contacts 235 of the interposer die 170. Moreover, the transistors used to implement the components of interposer die 170 may have larger gate lengths and/or widths. As such, the components of interposer die 170 may have a different threshold voltage and/or maximum operating frequency than the components of logic dice 120. Additionally, the logic dice 120 and/or the interposer dice 170 may include multiple power supply rails to deliver multiple power supply voltage levels. In particular, the devices of the interposer dice 170 may be operated using different power supply voltages than the devices of logic dice 120.

As shown in FIGS. 3A-B, the use of interposer dies 170 as described herein, allows for an increase in the size of an integrated circuit, allows for the use of additional metal layer in the routing of signals, and allows for the amplification or buffering of signals going between logic dice 120 without spending area in the logic dice for amplifier or buffer circuitry.

Figure 4A:
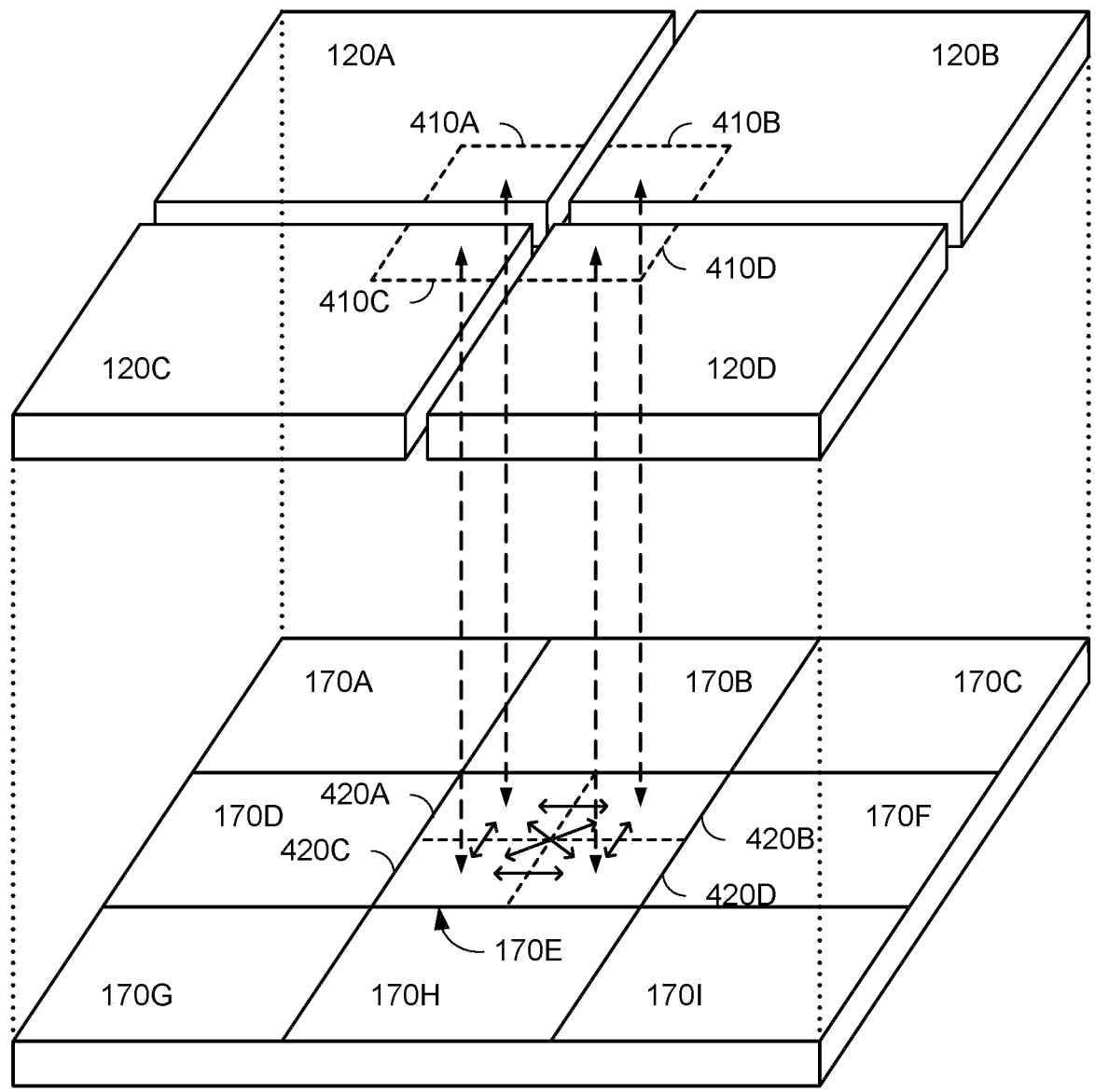
FIG. 4A is an exploded elevation view of a first implementation of a high-speed interposer, according to one embodiment.

FIG. 4A is an exploded elevation view of a first implementation of a high-speed interposer, according to one embodiment. In the example of FIG. 4A, four logic dice 120A-D are aligned to a three-by-three array of interposer dice 170A-I. Moreover, in the example of FIG. 4A, interposer die 170E is used to interconnect the four logic dice 120A-D to each other. That is, the input and output contacts in first logic die 120A are bonded to contacts in the top left corner of interposer die 170E, the input and output contacts in second logic die 120B are bonded to the contacts in the top right corner of interposer die 170E, the input and output contacts in the third logic die 120C are bonded to the contacts in the bottom left corner of interposer die 170E, and the input and output contacts in the fourth logic die 120D are bonded to the contacts in the bottom right corner of interposer die 170E. The interposer die 170E then routes the signals from one die to another die. In the implementation of FIG. 4A, interposer dice surrounding interposer die 170E are not used for routing signals. That is, interposer dice 170A, 170B, 170C, 170D, 170F, 170G, 170H, and 170I are not used for routing signals. Instead, those interposers are used for structural support of logic dice 120A-D. In some embodiments, interposers 170A-I may additionally be used to provide connections to external inputs/outputs (I/O) and power.

Since interposer dice surrounding interposer die 170E are not used for routing signals, defective interposer dice may be used. As such, the yield of the interposer arrays 160 may be increased. For instance, if a defective interposer die 170 is found, the defective interposed can be used for structural support as part of an interposer array 160 if the defective interposer surrounds a working interposer die 170.

In some embodiments, the logic dice 120 are rotated such that the contacts 410 for connecting to the logic dice 120 to the interposer die 170E overlap interposer die 170E. That is, the first logic die 120A may be rotated by 0°, the second logic die 120B may be rotated by 90° clockwise, the third logic die 120C is rotated 90° counterclockwise, and the fourth logic die may be rotated by 180°. As such, the same circuitry and layout may be used for each of the logic dice 120.

In other embodiments, the second logic die 120B may be implemented as mirror layout as the first logic die 120A. That is, the first logic die 120A and the second logic die 120B are fabricated in two different wafers 110. In yet other embodiments, at least a first subset of logic dice 120 implement a different logic or circuitry as a second subset of logic dice 120. Using this implementation, a circuit designer can optimize the placement of the logic modules based on design constraints such as placing the logic modules that are in a critical timing path in a single die and placing other peripheral circuitry in other dice.

Figure 4B:
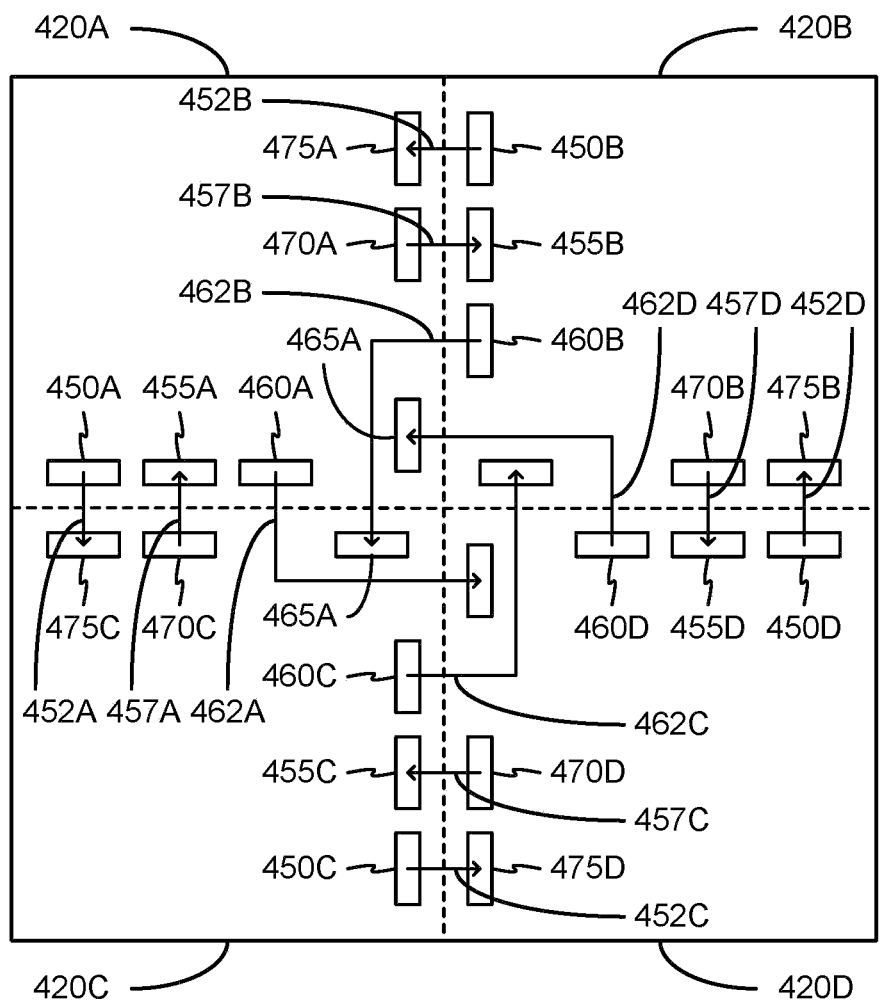
FIG. 4B is a diagram of the high-speed interposer die of FIG. 4A, according to one embodiment.

FIG. 4B is a diagram of the high-speed interposer die of FIG. 4A, according to one embodiment. The interposer die 170 is divided in four quadrants 420A-D. Each of the quadrants correspond to one logic die 120. For instance, first quadrant 420A corresponds to the first logic die 120A, the second quadrant 420B corresponds to the second logic die 120B, the third quadrant 420C corresponds to the third logic die 120C, and fourth quadrant 420D corresponds to the fourth logic die 120D.

Each of the quadrants 420 include input contacts for receiving signals from a logic die and output contacts for transmitting signals to a logic die. Moreover, the interposer die 170 includes connections between an input contact and an output contact. In some embodiments, the connections between an input contact and an output contact include active components for amplifying the signal received from a logic die. For instance, the active components may include a buffer. In other embodiments, the active component may include a latch or register.

Each quadrant 420 includes a first array of input contacts 450 for receiving signals from a first logic die to be transmitted to a first adjacent logic die through an array of output contacts 475. Moreover, each quadrant includes a first array of output contacts 455 to transmit signals received from the first adjacent logic die through an array of input contacts 470 to the first logic die. Each quadrant further includes a second set of input contacts 470 for receiving signals from the first logic die to be transmitted to a second adjacent logic die through an array of output contacts 455. Moreover, each quadrant includes a second array of output contacts 475 to transmit signals received from the second adjacent logic die through an array of input contacts 450 to the first logic die.

Each of the input contacts of the input contact array 450 of a first quadrant is coupled to a corresponding output contact of the output contact array 475 of an adjacent quadrant through interconnect 452. For instance, an input contact of the input contact array 450A of first quadrant 420A is coupled to an output contact of the output contact array 475C of the third quadrant 420C through interconnect 452A.

Each of the output contacts of the output contact array 455 of a first quadrant is coupled to a corresponding input contact of the input contact array 470 of an adjacent quadrant through interconnect 457. For instance, an output contact of the output contact array 455A of the first quadrant 420A is coupled to an input contact of the input contact array 470C of the third quadrant 420C through interconnect 457A.

Each quadrant 420 further includes a third array of input contacts 460 for receiving signals from a first logic die to be transmitted to a logic die located diagonally from the first logic die. Moreover, each quadrant 420 includes a third array of output contacts 465 to transmit signals received from the logic die located diagonally from the first logic die to the first logic die. Each input contact of the third array of input contacts 460 of a first quadrant is coupled to a corresponding output contact of the third array of output contacts 465 of a quadrant located diagonally from the first quadrant.

Figure 4C:
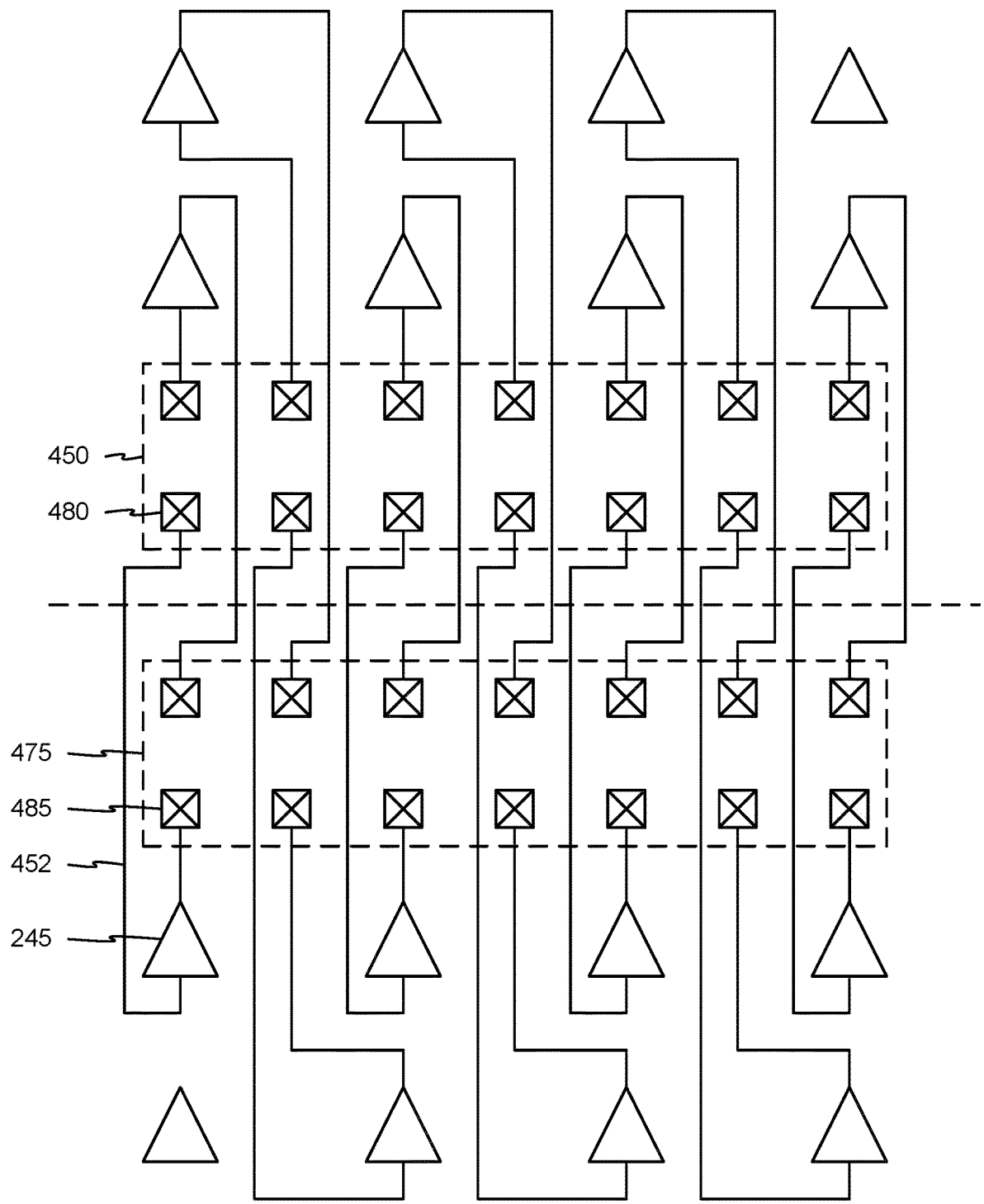
FIG. 4C is a diagram showing a pair of contact arrays, according to one embodiment.

FIG. 4C is a diagram showing a pair of contact arrays, according to one embodiment. In the example of FIG. 4C, the input contact array 450 includes two rows of contacts. Similarly, the output contact array 475 includes two rows of contacts. In other embodiments, other configurations may be used. For example, contact arrays with three or more rows of contacts may be used. In the example of FIG. 4C, each input contact 480 is connected to the input terminal of a buffer 245. Moreover, each output contact 485 is connected to the output terminal of a buffer 245. As such, a signal may be transmitted from the one input contact 480 of the input contact array 450 to a corresponding output contact 485 of the output contact array 475.

In some embodiments, for example, when the interposer dice 170 and the logic dies are fabricated using different process technologies, a level shifter may be added at the input and or output of the buffers 245. The level shifters at the input of the buffers 245 change the voltage level of the logic signals based on an operating voltage range of the devices in the interposer dice 170. In one embodiment, the level shifters at the input of the buffers 245 increases a voltage level of signals received through each of the input contacts 480 of the input contact array 450. Additionally, the level shifters at the output of the buffers 245 change the voltage level of the logic signals generated by the buffers 245 based on an operating voltage range of the devices in the logic dice 120. In one embodiment, the level shifters at the output of the buffers 245 decrease the voltage level of signals generated by the buffers 245 and to be transmitted through each of the output contacts 485 of the output contact array 475.

Figure 5A:
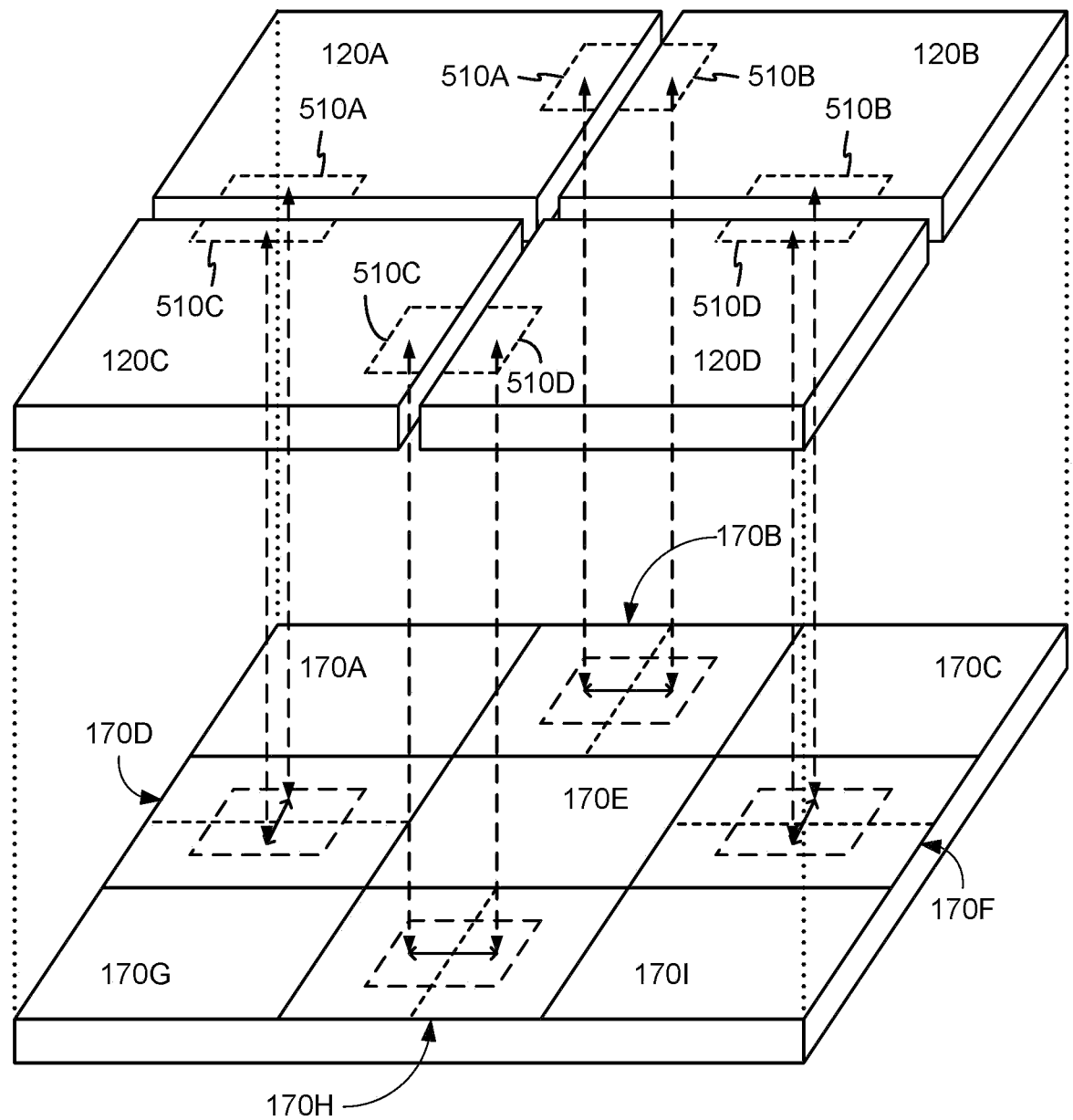
FIG. 5A is an exploded elevation view of a second implementation of a high-speed interposer, according to one embodiment.

FIG. 5A is an exploded elevation view of a second implementation of a high-speed interposer, according to one embodiment. In the example of FIG. 5A, four logic dice 120A-D are aligned to a three-by-three array of interposer dice 170A-I. Moreover, in the example of FIG. 4A, interposer die 170B is used to interconnect the first logic die 120A and the second logic die 120B together, interposer die 170D is used to interconnect the first logic die 120A and the third logic die 120C together, interposer die 170F is used to interconnect the second logic die 120B and the fourth logic die 120D together, and interposer die 170H is used to interconnect the third logic die 120C and the fourth logic die 120D together. In the implementation of FIG. 5A, interposer dice 170A, 170C, 170E, 170G, and 170I are not used for routing signals. Instead, those interposers are used for structural support of logic dice 120A-D.

Since interposer dice 170A, 170C, 170E, 170G, and 170I are not used for routing signals, defective interposer dice may be used. As such, the yield of the interposer arrays 160 may be increased. For instance, if a defective interposer die 170 is found, the defective interposed can be used for structural support as part of an interposer array 160 if the defective interposer surrounds a working interposer die 170.

In some embodiments, the logic dice 120 are rotated such that the contacts 510 for connecting to the logic dice 120 to the interposer dice 170B, 170D, 170F, and 170H overlap interposer dice 170B, 170D, 170F, and 170H. That is, the first logic die 120A may be rotated by 0°, the second logic die 120B may be rotated by 90° clockwise, the third logic die 120C is rotated 90° counterclockwise, and the fourth logic die may be rotated by 180°. As such, the same circuitry and layout may be used for each of the logic dice 120.

In other embodiments, the second logic die 120B may be implemented as mirror layout as the first logic die 120A. That is, the first logic die 120A and the second logic die 120B are fabricated in two different wafers 110. In yet other embodiments, at least a first subset of logic dice 120 implement a different logic or circuitry as a second subset of logic dice 120. Using this implementation, a circuit designer can optimize the placement of the logic modules based on design constraints such as placing the logic modules that are in a critical timing path in a single die and placing other peripheral circuitry in other dice.

Figure 5B:
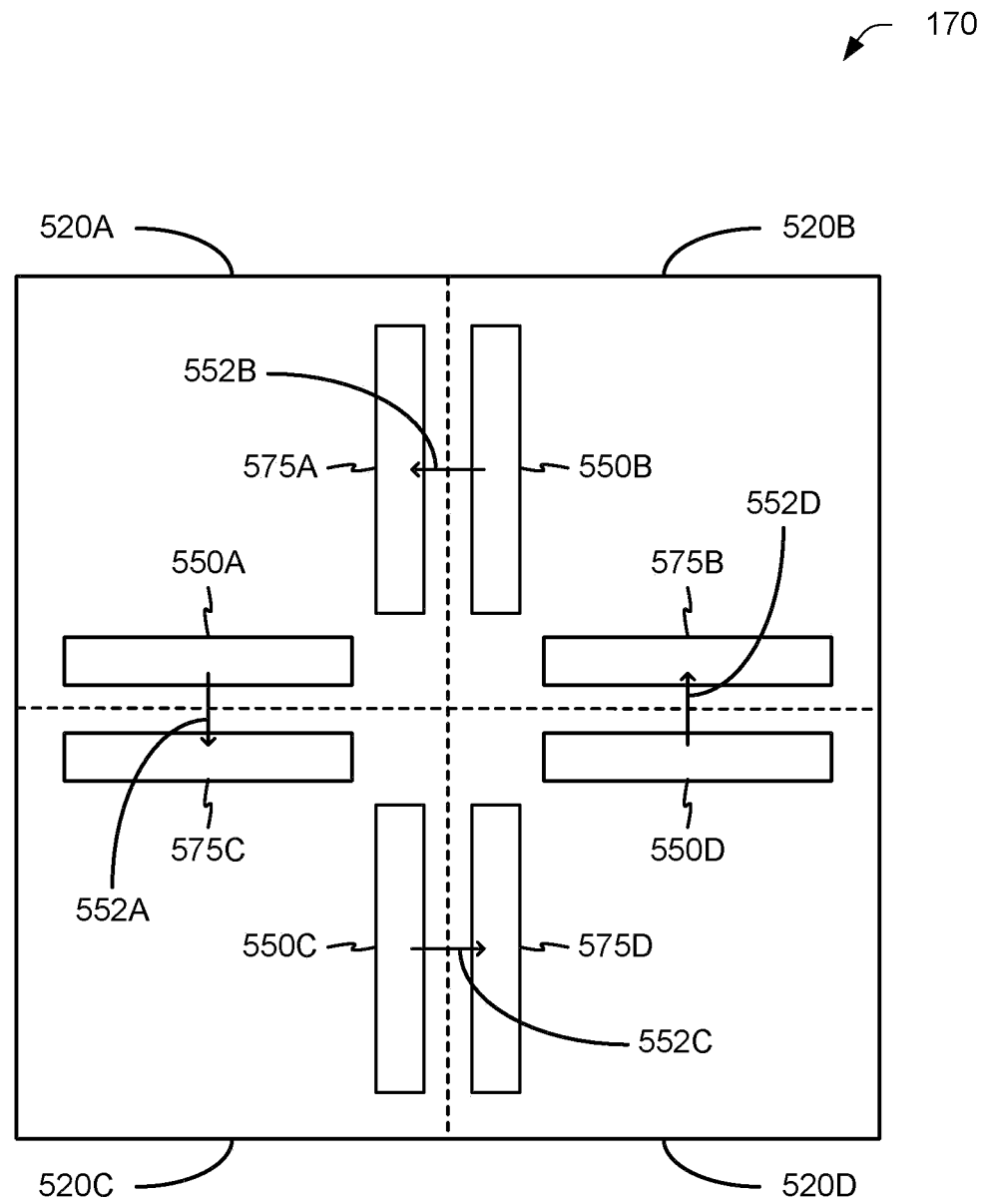
FIG. 5B is a diagram of the high-speed interposer die of FIG. 5A, according to one embodiment.

FIG. 5B is a diagram of the high-speed interposer die of FIG. 5A, according to one embodiment. The interposer die 170 is divided in four quadrants 520A-D. In the design of FIG. 5B, two quadrants correspond to one logic die 120. For instance, if the interposer die 170 is used to connect logic dice in the row direction, the first quadrant 520A and the third quadrant 520C correspond to a left logic die 120, and the second quadrant 520B and the fourth quadrant 520D correspond to a right logic die 120. Moreover, if the interposer die 170 is used to connect logic dice in the column direction, the first quadrant 520A and the second quadrant 520B correspond to a front logic die 120, and the third quadrant 520C and the fourth quadrant 520D correspond to a back logic die 120.

Each quadrant 520 of interposer die 170 includes an array of input contacts 550 and an array of output contacts 575. The input contacts of an array of input contacts 550 is coupled to a corresponding output contact of an array of output contacts 575 through interconnect 552.

Depending on the location of the logic die 120, the logic die 120 is connected to input contacts of one array of input contacts 550, and output contacts of one array of output contacts 575. For instance, with respect to interposer die 170B, the first logic die 120A is connected to the output contacts of the array of output contacts 575A of the first quadrant 520A and the input contacts of the array of input contacts 550C of the third quadrant 520C. Moreover, with respect to interposer 170B, the second logic die 120B is connected to the input contacts of the array of input contacts 550B of the second quadrant 520B and the output contacts of the array of output contacts 575D of the fourth quadrant 520D. Thus, the first logic die 120A can send signals to the second logic die 120B through the array of input contacts 550C in the third quadrant 520C, and the second logic die 120B can receive the signals from the first logic die 120A through the array of output contacts 575D of the fourth quadrant 520D. Additionally, the second logic die 120B can send signals to the first logic die 120A through the array of input contacts 550B in the second quadrant 520B, and the first logic die 120A can receive the signals from the second logic die 120B through the array of output contacts 575A of the first quadrant 520A. In this implementation, the array of input contacts 550A in the first quadrant 520A the array of input contacts 550D in the fourth quadrant 520D, the array of output contacts 575C in the third quadrant 520D, and the array of output contacts 575B in the second quadrant 520B are unused.

With respect to interposer die 170D, the first logic die 120A is connected to the input contacts of the array of input contacts 550A of the first quadrant 520A and the output contacts of the array of output contacts 575B of the second quadrant 520B. Moreover, with respect to interposer 170D, the third logic die 120C is connected to the output contacts of the array of output contacts 575C of the third quadrant 520C and the input contacts of the array of input contacts 550D of the fourth quadrant 520D. Thus, the first logic die 120A can send signals to the third logic die 120B through the array of input contacts 550A in the first quadrant 520A, and the third logic die 120C can receive the signals from the first logic die 120A through the array of output contacts 575C of the third quadrant 520C. Additionally, the third logic die 120C can send signals to the first logic die 120A through the array of input contacts 550D in the fourth quadrant 520D, and the first logic die 120A can receive the signals from the third logic die 120C through the array of output contacts 575B of the second quadrant 520B. In this implementation, the array of input contacts 550B in the second quadrant 520B the array of input contacts 550C in the third quadrant 520C, the array of output contacts 575A in the first quadrant 520A, and the array of output contacts 575D in the fourth quadrant 520D are unused.

With respect to interposer die 170F, the second logic die 120B is connected to the input contacts of the array of input contacts 550A of the first quadrant 520A and the output contacts of the array of output contacts 575B of the second quadrant 520B. Moreover, with respect to interposer 170D, the fourth logic die 120D is connected to the output contacts of the array of output contacts 575C of the third quadrant 520C and the input contacts of the array of input contacts 550D of the fourth quadrant 520D. Thus, the second logic die 120B can send signals to the fourth logic die 120D through the array of input contacts 550A in the first quadrant 520A, and the fourth logic die 120D can receive the signals from the second logic die 120B through the array of output contacts 575C of the third quadrant 520C. Additionally, the fourth logic die 120D can send signals to the second logic die 120B through the array of input contacts 550D in the fourth quadrant 520D, and the second logic die 120B can receive the signals from the fourth logic die 120D through the array of output contacts 575B of the second quadrant 520B. In this implementation, the array of input contacts 550B in the second quadrant 520B the array of input contacts 550C in the third quadrant 520C, the array of output contacts 575A in the first quadrant 520A, and the array of output contacts 575D in the fourth quadrant 520D are unused.

Finally, with respect to interposer die 170H, the third logic die 120C is connected to the output contacts of the array of output contacts 575A of the first quadrant 520A and the input contacts of the array of input contacts 550C of the third quadrant 520C. Moreover, with respect to interposer 170H, the fourth logic die 120D is connected to the input contacts of the array of input contacts 550B of the second quadrant 520B and the output contacts of the array of output contacts 575D of the fourth quadrant 520D. Thus, the third logic die 120C can send signals to the fourth logic die 120D through the array of input contacts 550C in the third quadrant 520C, and the fourth logic die 120D can receive the signals from the third logic die 120C through the array of output contacts 575D of the fourth quadrant 520D. Additionally, the fourth logic die 120D can send signals to the third logic die 120C through the array of input contacts 550B in the second quadrant 520B, and the third logic die 120C can receive the signals from the fourth logic die 120D through the array of output contacts 575A of the first quadrant 520A. In this implementation, the array of input contacts 550A in the first quadrant 520A the array of input contacts 550D in the fourth quadrant 520D, the array of output contacts 575C in the third quadrant 520D, and the array of output contacts 575B in the second quadrant 520B are unused.

Figure 6:
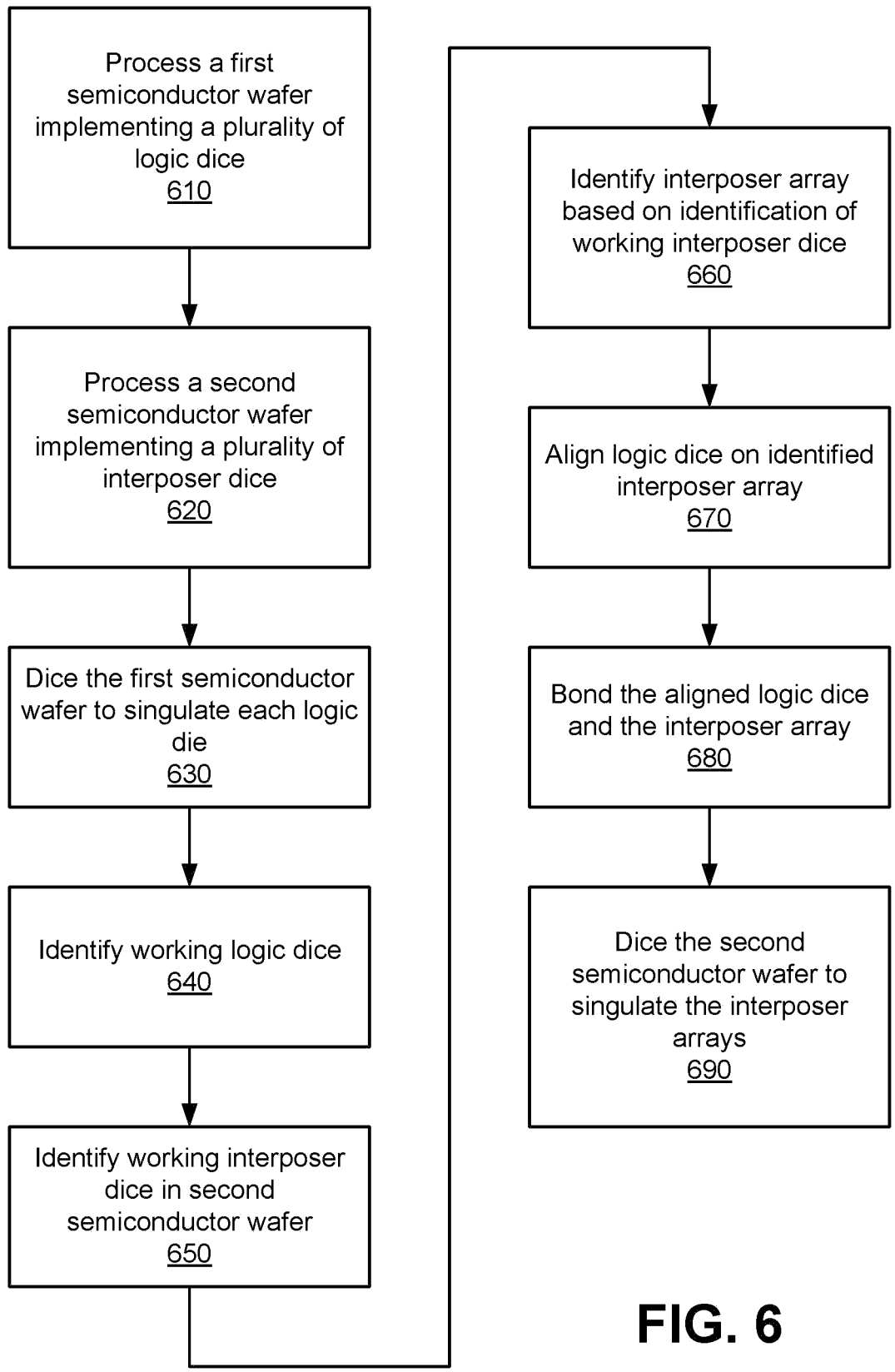
FIG. 6 is a flow diagram for fabricating an electronic circuit implemented using multiple logic dice, according to one embodiment.

FIG. 6 is a flow diagram for fabricating an electronic circuit implemented using multiple logic dice, according to one embodiment. A first semiconductor wafer 110 is processed 610 to implement the logic dice 120 and a second semiconductor wafer 150 is processed 620 to implement the interposer dice 170. The first semiconductor wafer 110 is diced 630 to singulate each logic die 120.

The logic dice 120 of the first semiconductor wafer 110 are tested to identify 640 the working dice. For instance, a probe card may be used to determine if an output of each of the logic dice 120 produce an expected value. In some embodiments, the testing of the logic dice 120 is performed before singulation. In other embodiments, the testing is performed after singulation.

Working interposer dice 170 are identified 650 in the second semiconductor wafer 150. For instance, a probe card is used to test the continuity of the connection between input contacts and output contacts of each of the interposer dice 170. If an open or a short is identified in an interposer die, the interposer die is determined to be defective. In some embodiments, testing of an interposer die 170 additionally includes performing built-in self-testing using test circuitry embedded inside each interposer die 170. In some embodiments, interposer dice 170 include additional contacts for redundancy in case some defects are present. In some embodiments, testing of an interposer die 170 may include determining if an additional contact that can replace a defective contact is present in the interposer die 170 such that a signal can be rerouted through the additional contact instead of the defective contact. After the working interposer dice 170 are identified, a plurality of interposer arrays is identified 660. In some embodiments, the interposer arrays are identified such that the number of working used is optimized.

Logic dice 120 are then selected and aligned 670 to the identified interposer arrays. In some embodiments, the logic dice 120 are aligned using a pick and place machine. In some embodiments, the logic dice 120 and the interposer dice 170 include alignment marks used to align the logic dice 120 to the interposer arrays 160 such that the input contacts of the logic dice 120 are aligned to the output contacts of the interposer dice 170 and the output contacts of the logic dice 120 are aligned to the input contacts of the interposer dice 170.

The aligned logic dice 120 are bonded to the second semiconductor wafer 150. The second semiconductor wafer 150 is diced 690 to singulate the interposer arrays 160. In some embodiments, the interposer arrays 160 are packaged and installed on a printed circuit board to be connected to other components of an electronic system.

Figure 7A:
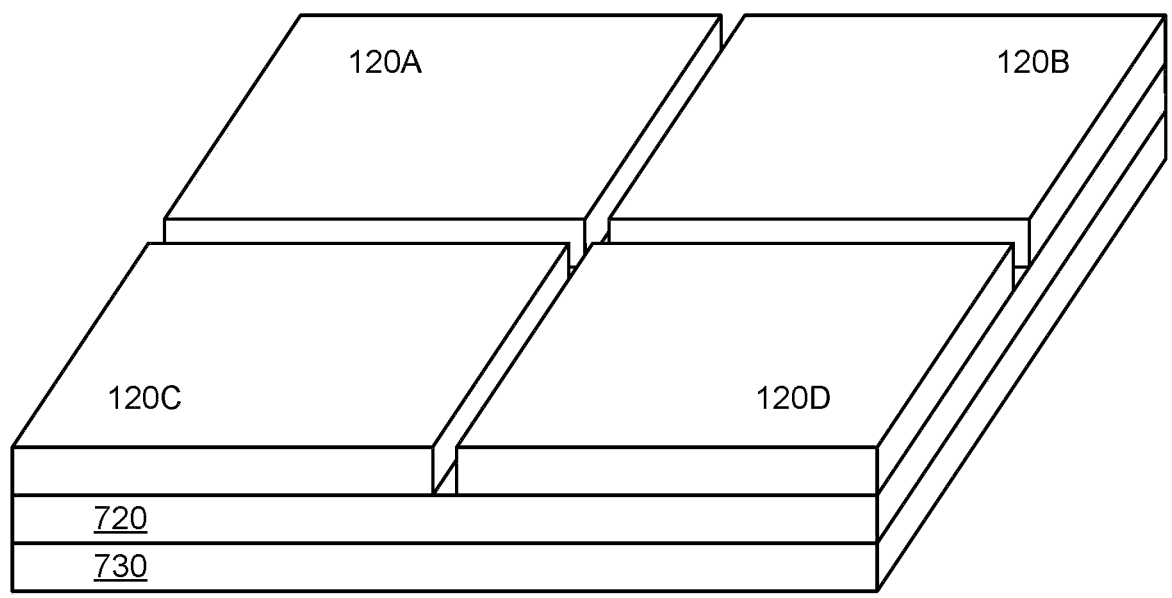
FIG. 7A is an elevation view of an integrated circuit implemented using multiple logic dice, one or more interposer dice, and a substrate, according to one embodiment.

FIG. 7A is an elevation view of an integrated circuit implemented using multiple logic dice, one or more interposer dice, and a substrate, according to one embodiment. In the embodiments of 7A, instead of using an array of interposer dice, singulated interposer dice 170 are placed on a substrate 730. The interposer dice 730 are then surrounded by a filler material 720 to provide structural support of the logic dice 120. Various examples of the integrated circuit configuration are shown in conjunction with FIGS. 7B and 7C.

Figure 7B:
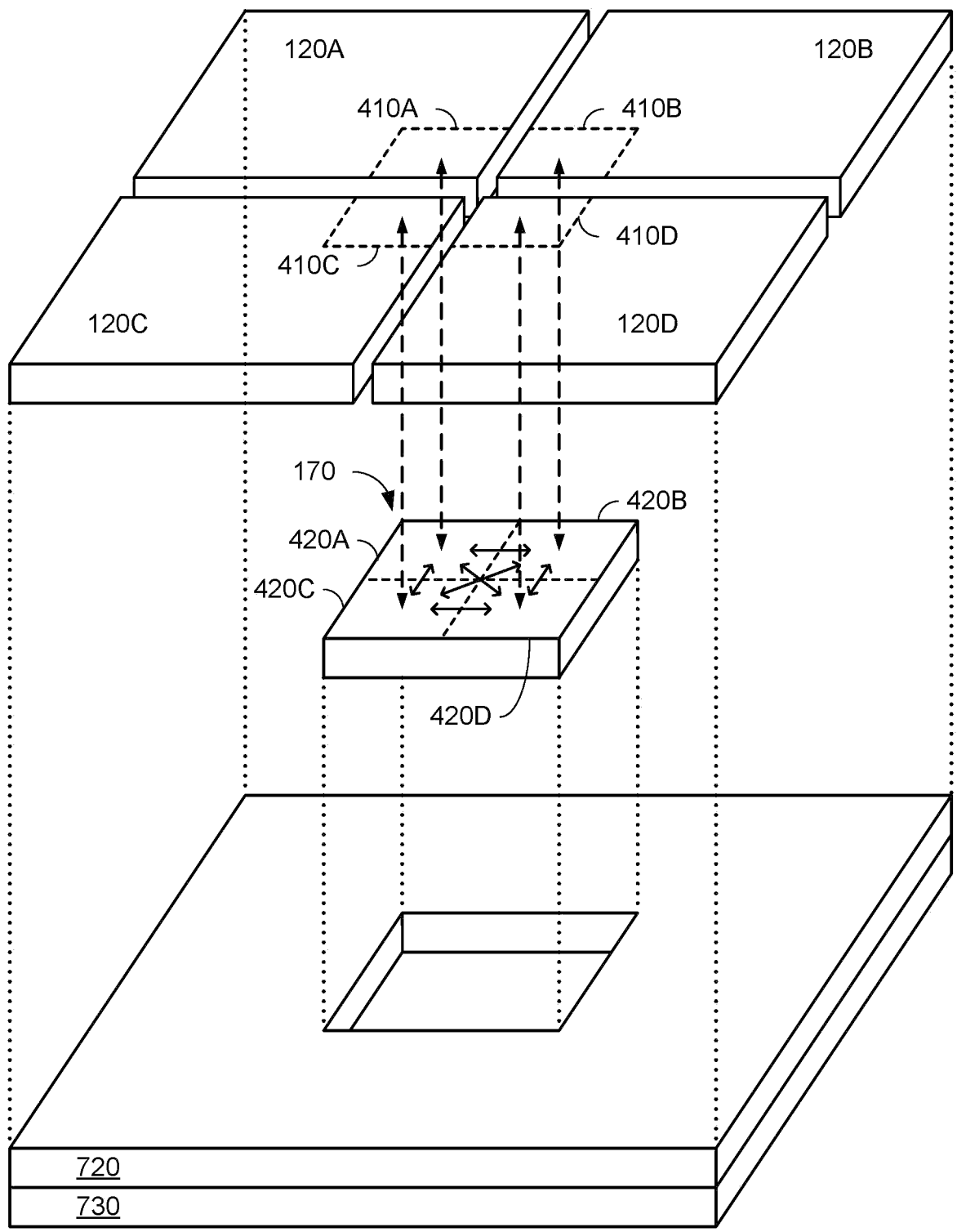
FIGS. 7B and 7C are exploded elevation views of additional configurations of high-speed interposers, according to various embodiments.
Figure 7C:
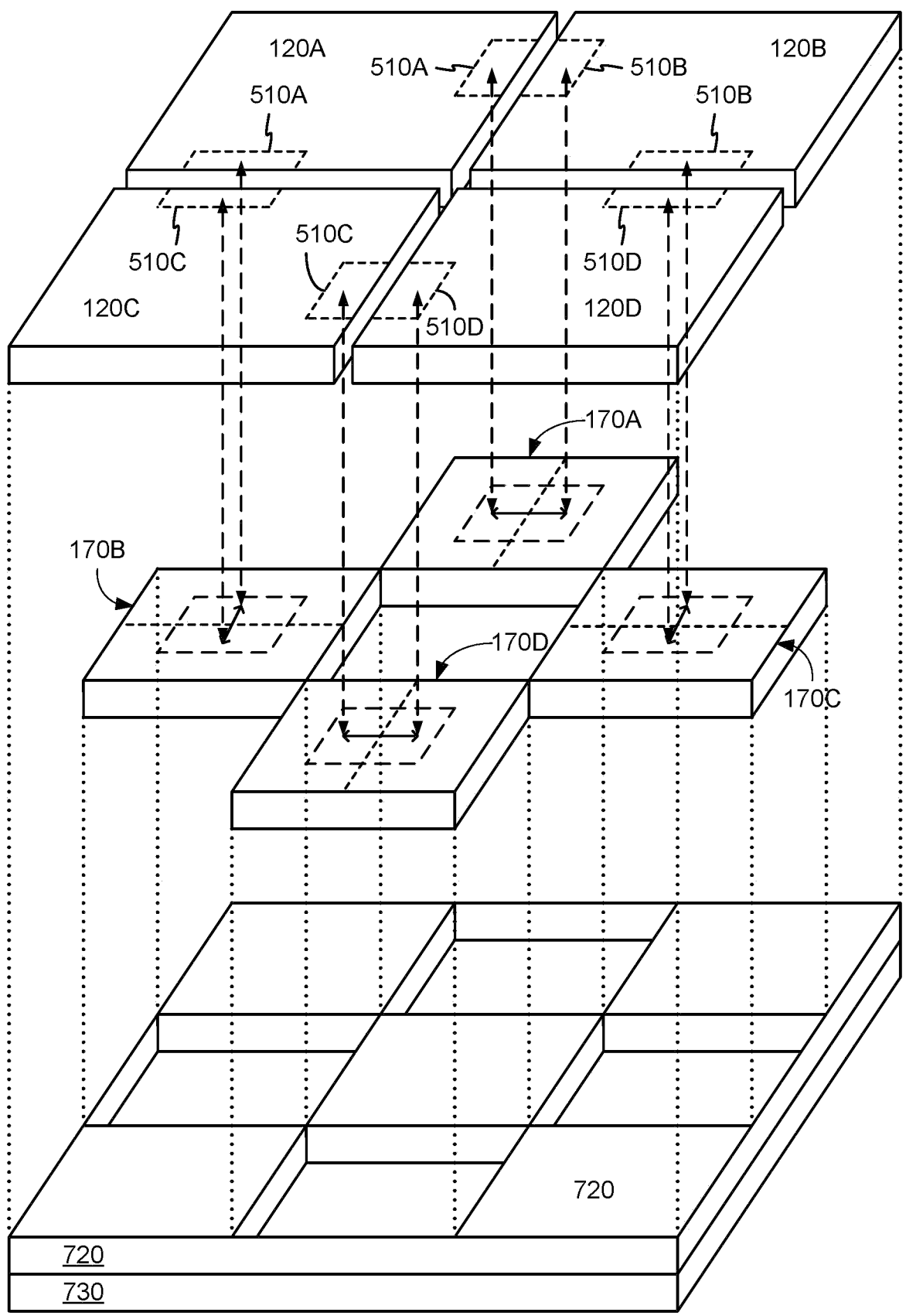

FIGS. 7B and 7C are exploded elevation views of various configurations of high-speed interposers, according to various embodiments. In the embodiments of FIGS. 7A and 7B, after the second semiconductor wafer is tested to identify the working interposer dice 170, the interposer dice 170 are singulated and placed on a substrate 730. In some embodiments, such as the one depicted in FIG. 7, only one interposer die 170 is placed on the glass substrate 730 and used to route signals to and from each of the logic dice 120. In other embodiments, such as the one depicted in FIG. 7B, multiple interposer dice 170 are placed on the glass substrate 730. For instance, in the example of FIG. 7B, four interposer dice 170A-D are used. In some embodiments, the substrate 730 is a glass substrate. In other embodiments, other types of substrates 730 may be used.

A filler material 720 that surrounds the interposer dice 170 is additionally placed on the substrate 730. The logic dice 120A-D are then aligned to the interposer dice 170 and bonded to the interposer dice 170. In some embodiments, the interposer dice 170 are aligned to the substrate 730. For example, if multiple interposer dice 170 are used, each of the interposer dice 170 may be aligned to marks on the substrate 730 such that the interposer dice 170 are aligned to each other.

As used herein any reference to "one embodiment" or "an embodiment" means that a particular element, feature, structure, or characteristic' described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. An integrated circuit comprising:
a first set of dies, each die comprising circuitry; and
a second set of interposer dies, the second set of interposer dies collectively having a smaller perimeter than a collective perimeter of the first set of dies, at least two dies of the first set of dies being connected to each other via at least one of the interposer dies, the at least one of the interposer dies including first connections connected to a first die of the first set of dies, second connections connected to a second die of the first set of dies, and buffers connected between the first connections and the second connections, the buffers being configured to condition signals between the first die and the second die.

2. The integrated circuit of claim 1 wherein the buffers include amplifiers to amplify the signals between the first die and the second die.

3. The integrated circuit of claim 1 wherein the buffers include one or more logic circuits to amplify the signals between the first die and the second die.

4. The integrated circuit of claim 1 wherein the interposer dies are fabricated using a different process than the second set of dies.

5. The integrated circuit of claim 1 wherein the first set of dies includes fewer dies than the second set of interposer dies.

6. The integrated circuit of claim 1 wherein each die of the first set of dies includes a set of connections to connect the respective die to one of the interposer dies and wherein the each die includes a set of buffers connected between the set of connections and the circuitry of the respective die, the buffers being configured to condition signals between the set of connections and the circuitry.

7. The integrated circuit of claim 1 wherein one interposer die of the second set of interposer dies is connected to four dies of the first set of dies.

8. The integrated circuit of claim 7 wherein:
the one interposer die has a smaller perimeter than a collective perimeter of the four dies; and
a plurality of interposer dies surround the one interposer die, the plurality of interposer dies having a collective perimeter aligned with the collective perimeter of the four dies, the plurality of interposer dies being electrically unconnected to the four dies, and the plurality of interposer dies structurally supporting the four dies.

9. The integrated circuit of claim 1 wherein:
the first set of dies comprises four dies arranged in a 2×2 array;
the second set of interposer dies comprises nine interposer dies arranged in a 3×3 array;
each of the four dies includes connections at corners converging at a center of the 2×2 array; and
a single interposer die among the second set of interposer dies located at a center of the 3×3 array includes connections configured to electrically couple the single interposer die to the four dies.

10. The integrated circuit of claim 9 wherein:
the second set of interposer dies has a collective perimeter aligned with a collective perimeter of the first set of dies; and
eight of the nine interposer dies surrounding the single interposer die are electrically unconnected to the four dies and provide structural support to the four dies.

11. The integrated circuit of claim 1 wherein:
the first set of dies comprises four dies arranged in a 2×2 array;
the second set of interposer dies comprises nine interposer dies arranged in a 3×3 array;
each of the four dies includes connections on edges adjacent to a neighboring one of the four dies; and
four of the second set of interposer dies other than those at a center and four corners of the 3×3 array include connections to interconnect different pairs of the four dies.

12. The integrated circuit of claim 11 wherein the second set of interposer dies has a collective perimeter aligned with a collective perimeter of the first set of dies.

13. The integrated circuit of claim 11 wherein interposer dies at the center and the four corners of the 3×3 array are electrically unconnected to the four dies and provide structural support to the four dies.

14. The integrated circuit of claim 1 wherein the first set of dies comprises four dies arranged in a 2×2 array, the integrated circuit further comprising a substrate wherein the second set of interposer dies includes a single interposer die that is arranged on the substrate, the integrated circuit further comprising a filler material disposed on the substrate around the single interposer die to provide structural support to the four dies, wherein perimeters of the substrate and the filler material and a collective perimeter of the first set of dies are aligned with each other.

15. The integrated circuit of claim 14 wherein:
each of the four dies includes connections at corners converging at a center of the 2×2 array; and
the single interposer die includes connections to connect to the four dies.

16. The integrated circuit of claim 1 wherein the first set of dies comprises four dies arranged in a 2×2 array and the second set of interposer dies comprises four interposer dies, the integrated circuit further comprising:
a substrate having a perimeter aligned with a collective perimeter of the four dies; and
a filler material disposed on the substrate, the filler material having four slots such that the filler material covers the substrate at a center and four corners of the substrate and at the perimeter of the substrate;
wherein the four interposer dies are disposed in the four slots;
wherein each of the four dies includes connections on edges adjacent to a neighboring one of the four dies; and
wherein the four interposer dies include connections to interconnect different pairs of the four dies.

17. The integrated circuit of claim 16 wherein the filler material surrounds the four interposer dies and provides structural support to the four dies.

18. The integrated circuit of claim 16 wherein perimeters of the filler material and the substrate and the collective perimeter of the four dies are aligned with each other.

* * * * *